(12) United States Patent
Guillot et al.

(10) Patent No.: US 10,681,839 B2
(45) Date of Patent: Jun. 9, 2020

(54) COOLING MODULE AND ELECTRONIC UNIT COMPRISING SUCH A MODULE

(71) Applicants: SAFRAN ELECTRONICS & DEFENSE, Boulogne Billancourt (FR); SAFRAN ELECTRICAL & POWER, Blagnac (FR)

(72) Inventors: François Guillot, Boulogne (FR); Jean-Marc Blineau, Blagnac (FR); Philippe Avignon, Blagnac (FR); Serge Roques, Blagnac (FR); Franck Albero, Blagnac (FR)

(73) Assignees: SAFRAN ELECTRICAL & POWER, Blagnac (FR); SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

(21) Appl. No.: 16/337,903

(22) PCT Filed: Sep. 28, 2017

(86) PCT No.: PCT/EP2017/074724
§ 371 (c)(1),
(2) Date: Mar. 28, 2019

(87) PCT Pub. No.: WO2018/060390
PCT Pub. Date: Apr. 5, 2018

(65) Prior Publication Data
US 2020/0029462 A1 Jan. 23, 2020

(30) Foreign Application Priority Data
Sep. 30, 2016 (FR) ...................... 16 59477

(51) Int. Cl.
*G06F 1/16* (2006.01)
*H05K 5/00* (2006.01)
(Continued)

(52) U.S. Cl.
CPC ....... *H05K 7/20181* (2013.01); *H05K 7/2019* (2013.01); *H05K 7/20145* (2013.01)

(58) Field of Classification Search
CPC ........... H05K 7/20181; H05K 7/20145; H05K 7/2019; H05K 7/20209; H05K 7/20136; G06F 1/20; G06F 1/203; G06F 1/206
See application file for complete search history.

(56) References Cited

U.S. PATENT DOCUMENTS 2,628,482 A * 2/1953 Burgess ................. B64D 13/06
62/172
4,014,179 A * 3/1977 Iles ........................ B64D 13/06
62/88

(Continued)

FOREIGN PATENT DOCUMENTS

DE 10 2015 201 478 B3 3/2016

*Primary Examiner* — Anthony M Haughton
(74) *Attorney, Agent, or Firm* — Muncy, Geissler, Olds & Lowe, P.C.

(57) ABSTRACT

A cooling module including a first air inlet, a second air inlet, and an air discharge vent, the module having two check valves, each mounted in register with a respective inlet and arranged to allow air to pass towards the inside of the module and to oppose a flow of air in the opposite direction. An electronic unit including such a box.

6 Claims, 9 Drawing Sheets

(51) Int. Cl.
  *H05K 7/00*    (2006.01)
  *H05K 7/20*    (2006.01)

(56) References Cited

U.S. PATENT DOCUMENTS

| | | | |
|---|---|---|---|
| 4,437,320 A * | 3/1984 | Eklund | F25D 16/00 |
| | | | 62/236 |
| 4,742,864 A | 5/1988 | Duell et al. | |
| 5,491,979 A * | 2/1996 | Kull | B64D 11/0007 |
| | | | 165/104.28 |
| 7,028,753 B2 * | 4/2006 | Sterner | F28D 15/02 |
| | | | 165/121 |
| 7,121,100 B2 * | 10/2006 | Atkey | B64D 13/06 |
| | | | 62/86 |
| 9,555,892 B2 * | 1/2017 | Dessero | B64D 13/08 |
| 2003/0224717 A1 | 12/2003 | Tsai et al. | |
| 2005/0076661 A1 * | 4/2005 | Zywiak | B64D 11/04 |
| | | | 62/244 |
| 2016/0165750 A1 | 6/2016 | Tang et al. | |

* cited by examiner

COOLING MODULE AND ELECTRONIC UNIT COMPRISING SUCH A MODULE

The present invention relates to the field of cooling, and more particularly to the field of cooling electronic equipment.

STATE OF THE ART

Calculation units or bays are known, each of which comprises a box defining a compartment containing calculation modules that can be inserted into the compartment along an insertion axis through an opening of the compartment and that are connectable to connectors carried by a back wall of the compartment and extending into the compartment opposite from its opening. The term "calculation module" is used herein to cover any electronic circuit capable of processing signals and/or data, and in particular capable of performing calculations on those signals or data. The electronic circuit may form a computer and may comprise a set of processors of the application-specific integrated circuit (ASIC) type or of some other type, a programmable array such as a field programmable gate array (FPGA).

The temperature of such calculation modules tends naturally to rise while they are in operation, so it is necessary to cool them.

Cooling modules are either extremely basic, or on the contrary they are complex, in particular when they are provided with a main source of cooling air and with an additional source cooling air that is used in the event of the main source failing.

OBJECT OF THE INVENTION

An object of the invention is to provide a solution to that problem.

BRIEF SUMMARY OF THE INVENTION

To this end, the invention provides a cooling module comprising a first air inlet, a second air inlet, and an air discharge vent, the module having two check valves, each mounted in register with a respective inlet and arranged to allow air to pass towards the inside of the module and to oppose a flow of air in the opposite direction.

Thus, when one of the air inlets is not fed with air, the check valve closes spontaneously and prevents a loss of air that could decrease the useful stream of cooling air.

Advantageously, the first air inlet is connected to a pipe of air under pressure, and the second air inlet is an external air intake associated with a fan for injecting air into the common module.

Starting the fan serves to mitigate an absence of air under pressure in the pipe (the fan may be controlled by a control unit connected to a sensor for sensing pressure in the pipe or to a detector for detecting the state of operation of the device for blowing air into the pipe).

Preferably, the fan is associated with a device for filtering air by centrifuging.

Advantageously, under such circumstances, the fan comprises an impeller wheel driven by an electric motor to rotate in a casing, a circular peripheral wall extended tangentially by a vertical tangential passage having a bottom end with a dust-recovery container fastened thereto, the casing including an air inlet orifice in the vicinity of the axis of rotation of the impeller and at least one air outlet orifice in the vicinity of the circular peripheral wall.

The invention also provides an electronic unit comprising a box defining: a main compartment containing calculation modules suitable for insertion into the main compartment along an insertion axis through a first opening in the compartment and connectable to connectors carried by a back wall of the compartment so as to extend inside the compartment opposite from the first opening, and an additional compartment for receiving a cooling module of the invention, the additional compartment being arranged under the calculation modules and being in communication with the main compartment, the box including an air discharge vent leading out from the main compartment above the calculation modules.

Other characteristics and advantages of the invention appear on reading the following description of particular, non-limiting embodiments of the invention.

BRIEF DESCRIPTION OF THE FIGURES

Reference is made to the accompanying drawings, in which.

DETAILED DESCRIPTION OF THE INVENTION

Figure 1:
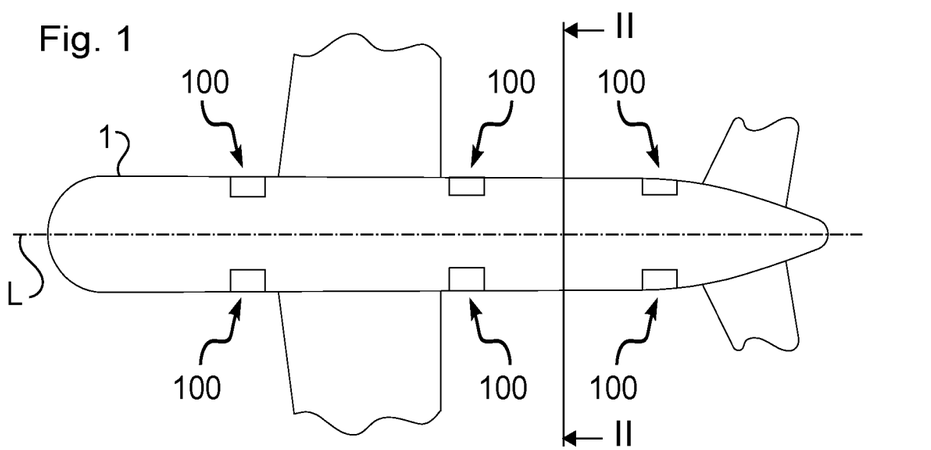
FIG. 1 is a diagrammatic view of an aircraft of the invention.
Figure 2:
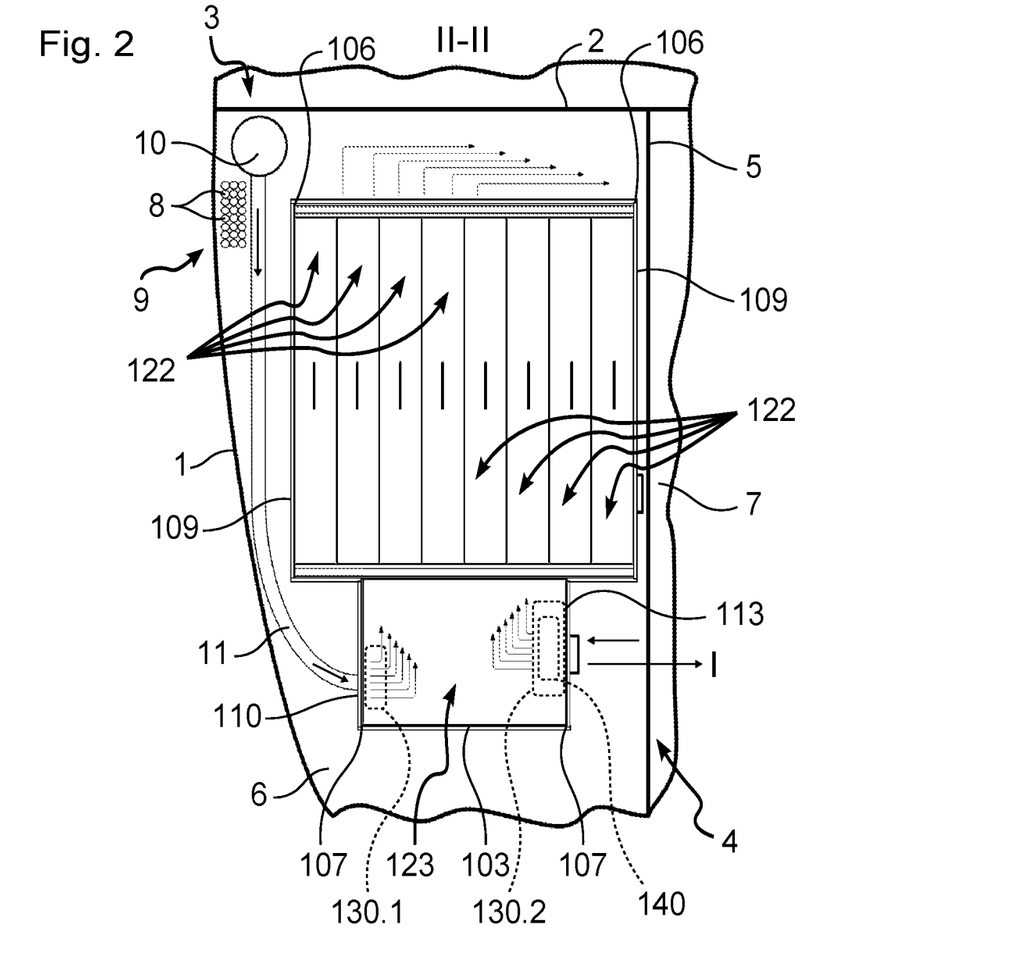
FIG. 2 is a diagrammatic view of the aircraft in section on line II of FIG. 1.

With reference to the figures, the aircraft generally comprises a fuselage 1 subdivided by a floor 2 into a top volume 3 and a bottom volume 4. The top volume 3 is for receiving seats for passengers and it constitutes the cabin of the aircraft; the bottom volume 4 is for receiving passenger baggage or freight and it constitutes the hold of the aircraft.

Girders 5 extend in the bottom volume 4 to support the floor 2 and they co-operate with the fuselage 1 and the floor 2 to define lateral housings 6 of cross-section that is substantially triangular and that extend parallel to a longitudinal axis L of the fuselage 1 on either side of a middle or central zone 7. In the lateral housings 6 under the floor 2 there extend cables 8 of the electrical harness 9 of the aircraft and one of the main air conditioning pipes or tubes 10 conveying air that is blown into the top volume 3 for air conditioning purposes. The electrical harness 9 is made up of cables used for transmitting power and cables for transmitting control signals and data.

Figure 3:
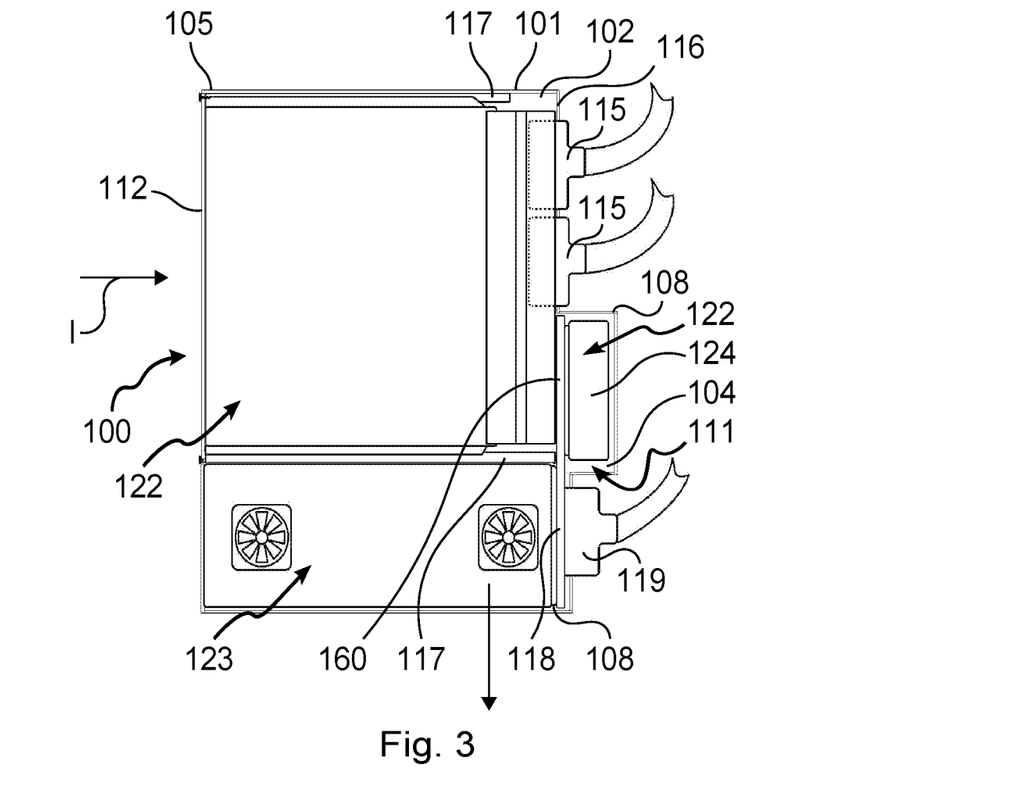
FIG. 3 is a diagrammatic side view of a calculation unit of the invention.

The aircraft has calculation units 100, each comprising a box 101 defining a main compartment 102, a first auxiliary compartment 103 extending under the main compartment 102, and a second auxiliary compartment 104 extending behind a top portion of the first auxiliary compartment 102 and behind a bottom portion of the main compartment 102. The box 101 has a front opening 105 giving access to the main compartment 102; two lateral openings 106 giving access to the main compartment 102; two lateral openings 107, opposite from each other, giving access to the first auxiliary compartment 103; and two lateral openings 108, opposite from each other, giving access to the second auxiliary compartment 104. The front opening 105 is left open; the lateral openings 106 are closed by a removable panel 109; the lateral openings 107, 108 facing towards the middle zone 7 are left open; the lateral openings 107, 108 facing away from the middle zone 7 are closed by a removable panel 110, 111. The removable panels are held in the closed position by a quick-connection mechanism or by screws. The panels 110, 111 may be mounted on one or the other of the lateral openings 107, 108 depending on the direction in which the calculation unit 100 is mounted in the lateral housings 6, as described below.

The main compartment 102 contains calculation modules, given overall reference 122; the first auxiliary compartment 103 contains a common module, given overall reference 123, for cooling and powering the calculation modules 122; and the second auxiliary compartment 104 contains a common module, given overall reference 124, for interconnecting the calculation modules 122. The common modules 123, 124 provide a transverse function for the calculation modules 122.

The calculation modules 122 can be inserted into the main compartment 102 along an insertion axis I through the front opening 105 of the box 101 and they are connectable to connectors 115 carried by a back wall 116 of the box 101 so as to extend into the main compartment 102 remotely from the front opening 105. Each calculation module 122 has an outwardly projecting front face which is fastened to the box 101 and which closes the opening 105 in part (this opening being completely closed when all of the calculation modules 122 are in place). The connectors 115 are connected to cables of the electrical harness 9 intended mainly for transmitting control signals and data so as to connect the calculation modules 122 mainly to the control instruments on which the pilot of the aircraft acts, to indicators for providing the pilot with information, to sensors distributed within the aircraft, and to the equipment of the aircraft. The calculation modules 122 comprise a printed circuit board carrying electronic control and/or power components: they are themselves known and are not described in greater detail herein. The calculation modules 122 also carry respective connectors on their edges remote from the opening 105 enabling them to be connected to connectors carried by a face of a printed circuit board 118 between the bottom portion of the back of the main compartment 102 and the second auxiliary compartment 104, and extending into the first auxiliary compartment 103. The calculation modules 122 are mounted in the main compartment 102 via slideways 117 that are fastened in the box 1 in order to extend perpendicularly to the opening 105 and thus parallel to the insertion axis I. The slideways 117 are made of thermally conductive material so as to conduct away a portion of the heat produced by the electronic components of the calculation modules 122 to the box 101. For this purpose, the box 101 is made at least in part out of thermally conductive material so as to enable the heat produced by the operation of the calculation modules 122 to be discharged to the outside. In addition, the box has openings in its top wall to allow a convective air stream to escape.

Figure 6:
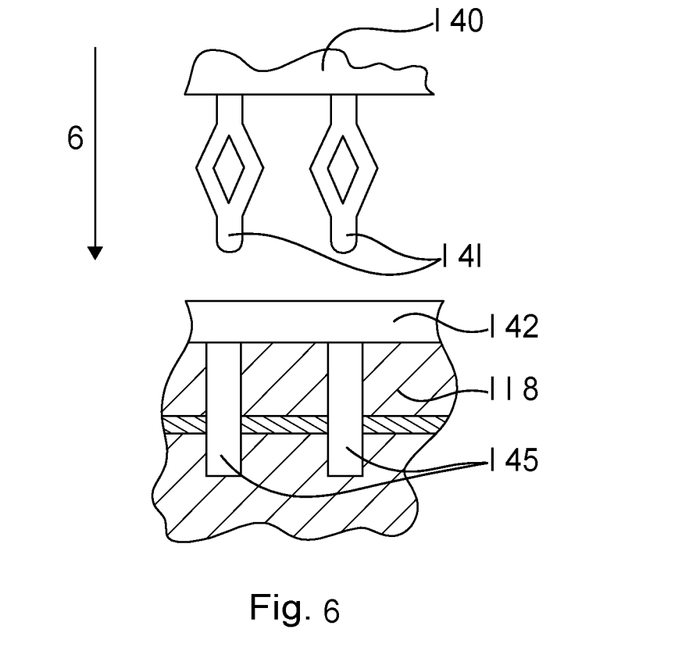
FIG. 6 is a cross-section view showing one of the calculation modules being connected to a printed circuit plate.

The connectors of the calculation modules 122 enabling them to be connected to the printed circuit board 118 include a projecting support 150 from which pins 151 extend parallel to the insertion axis I, which pins 151 are elastically deformable in a plane extending transversely to their longitudinal axes, between a relaxed state and a deformed state, the pins 151 presenting a cross-section in the relaxed state that is greater than in the deformed state. The corresponding connector of the printed circuit board 118 has metal-plated holes 152, each serving to receive a respective pin 151, which is engaged by force in the metal-plated hole and is held clamped therein in its deformed state. The printed circuit board 118 is not placed in an enclosure that is dust-proof. In an airplane having a fuselage made of carbon, there is a risk of carbon dust becoming deposited on the printed circuit plate, and of that giving rise to short circuits. To avoid that, the printed circuit board 118 is covered in a layer of electrically insulating material 153 that is pierced by the pins 151 when they are engaged in the metal-plated holes 152. When the calculation modules 122 are connected to the printed circuit board 118, the layer of electrically insulating material 153 is clamped between the supports 150 and the printed circuit board 118, thereby tending to close any tears that might be made by the pins 151, and thus preventing dust from penetrating between the calculation modules 122 and the printed circuit board 118. In this example, the electrically insulating material is a silicone, and more particularly a silicone that is suitable for room temperature vulcanization (RTV). Naturally, any material presenting elastomeric behavior could be used, and in particular silicones of other types.

The common module 123 is inserted in the first auxiliary compartment 103 via the lateral opening 107 facing towards the middle zone 7 along an insertion axis P that is perpendicular to the insertion axis I. The common module 123 has an overlapping front face 112 that is fastened to the box 101 and that cuts the opening 107.

Figure 7:
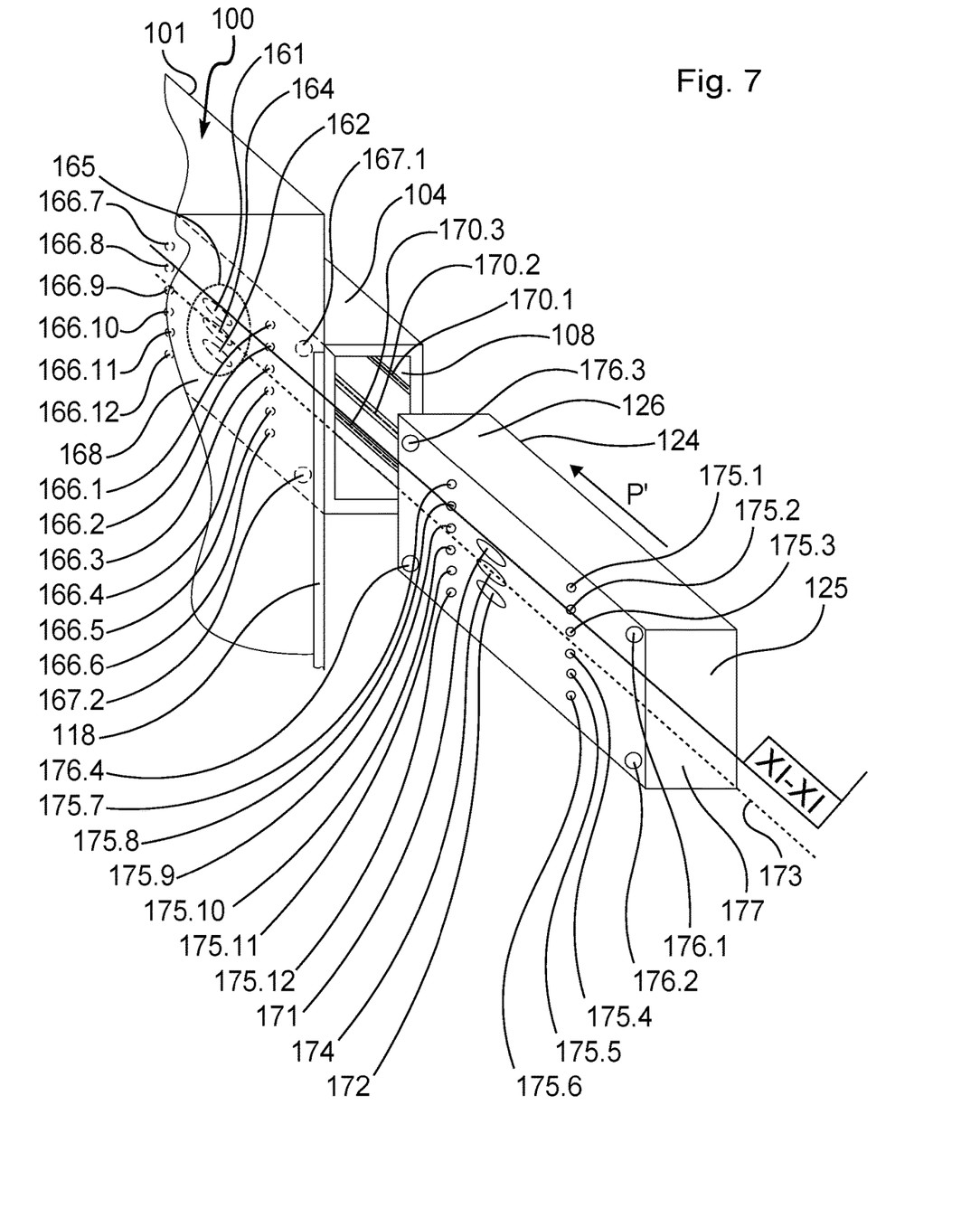
FIG. 7 is a fragmentary perspective view of a compartment of a calculation unit and of a first type of electronic module for mounting therein.
Figure 10:
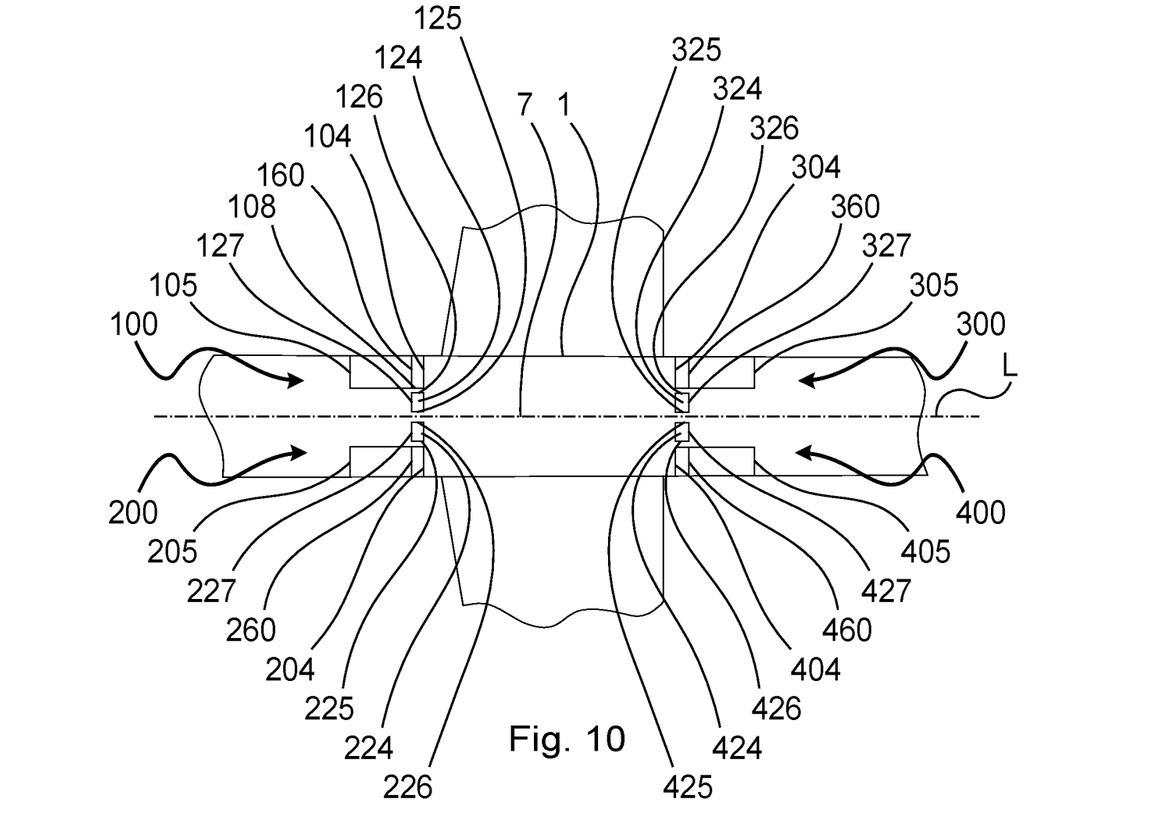
FIG. 10 is a view identical to FIG. 1 showing the electronic modules before they are installed in the calculation unit.

As can be seen in FIGS. 7 and 10, the common module 124 is inserted in the second auxiliary compartment 104 via the lateral opening 108 facing towards the middle zone 7 along an insertion axis P' perpendicular to the insertion axis I. The common module 124 has an outwardly-projecting front face that is fastened to the box 101 and that shuts the opening 108.

Both of the common modules 123 and 124 carry flexible contacts enabling them to be connected to conductive areas of the printed circuit board 118, which is itself connected firstly to the calculation modules 122 as mentioned above, and secondly to a connector 119 carried by the back wall 116 and connected to power cables and control cables of the electrical harness 9.

The flexible contacts are arranged on either side of a middle line parallel to the insertion axis so that the contacts for receiving power comprise a positive pole and a negative pole extending along a line perpendicular to the middle line, with one of the poles above the middle line and the other pole below the middle line.

The second auxiliary compartment 104 has a connection face 160 extending parallel to the insertion axis P', and facing the printed circuit 118. A first conductive area 161 and a second conductive area 162 arranged on either side of a middle line 163 of the connection face 160 extend onto the connection face 160. A central conductive area 164 situated on the middle line 163 also extends onto the connection face 160. The conductive areas 161, 162, and 164 are oblong and extend along an axis parallel to the middle line 163. The first conductive area 161 is connected to a first track of the printed circuit 118 and constitutes a positive pole of an electrical power supply 165, the second conductive area 162 is connected to a second track of the printed circuit 118 and constitutes a negative pole of an electrical power supply 165. The central conductive area 164 constitutes a ground of the electrical power supply 165. Magnetic couplers 166.1 to 166.12 also extend onto the connection face 160. A first series of magnetic couplers comprises the magnetic couplers 166.1 to 166.6, which extend symmetrically on either side of the middle line 163 close to a first opening 108 of the compartment 104. A second series of magnetic couplers comprises the magnetic couplers 166.7 to 166.12, which extend symmetrically on either side of the middle line 163 in the proximity of a second opening 108 of the compartment 104, remote from the first opening 108. Optical couplers 167.1 to 167.4 also extend onto the connection face 160. A first series of optical couplers comprises the optical couplers 167.1 and 167.2, which extend symmetrically on either side of the middle line 163 in the proximity of a first opening 108 of the compartment 104. A second series of optical couplers comprises the optical couplers 167.3 and 167.4, which extend symmetrically on either side of the middle line 163 in the proximity of a second opening 108 of the compartment 104 remote from the first opening 108. The first series of optical couplers 167.1 and 167.2, and the first series of magnetic couplers 166.1 to 166.6 are symmetrical respectively with the second series of optical couplers 167.3 and 167.4 and with the second series of magnetic couplers 166.7 to 166.12 about a midplane of the face 160 that extends orthogonally to the middle axis 163.

The magnetic couplers 166.1 to 166.12 and the optical couplers 167.1 to 167.4 are connected to the printed circuit 118. The connection face 160 is covered in a fine layer 168 of polytetrafluoroethyelene (PTFE) and the face 169 opposite from the connection face 160 has three longitudinal springs 170.1 to 170.3 extending parallel to the middle line 163. The printed circuit 118 is connected firstly to the calculation modules 122, as mentioned above, and secondly to a connector 119 carried by the back wall 116 and connected to power cables and control cables of the electrical harness 9.

In this example, the module 124 is of substantially rectangular box shape and comprises two insertion ends given respective references 125 and 126 of the module 124 leading into the compartment 104 along two opposite directions along the insertion axis P'. The module 124 also has a connection face 127 for connection to the box 100 onto which there extend first and second flexible contacts respectively 171 and 172 that are arranged on either side of a middle line 173 of the connection face 127. A central third flexible contact 174 situated on the middle line 173 also extends onto the connection face 127. As can be seen in FIG. 7, the flexible contacts 171, 172, and 174 extend along an axis parallel to the middle line 173 and the connection face 127 extends parallel to the insertion axis P'. Magnetic couplers 175.1 to 175.12 also extend onto the connection face 127. A first series of magnetic couplers comprises the magnetic couplers 175.1 to 175.6, which extend symmetrically on either side of the middle line 173 in the proximity of the insertion end 125. A second series of magnetic couplers comprises the magnetic couplers 175.7 to 175.12, which extend symmetrically on either side of the middle line 173 in the proximity of the insertion end 126. Optical couplers 176.1 to 176.4 also extend onto the connection face 127 and extend symmetrically on either side of the middle line 173. A first series of optical couplers comprises optical couplers 176.1 and 176.2, which extend symmetrically on either side of the middle line 173 in the proximity of the insertion end 125. A second series of optical couplers comprises the optical couplers 176.3 and 176.4, which extend symmetrically on either side of the middle line 173 in the proximity of the insertion end 126. The first series of optical couplers 176.1 and 176.2 and the first series of magnetic couplers 175.1 to 175.6 are symmetrical respectively to the second series of optical couplers 176.3 and 176.4 and to the second series of magnetic couplers 175.7 to 175.12 about a midplane of the face 127 orthogonal to the middle axis 173. The connection face 127 is covered in a fine layer 177 of PTFE.

Figure 8:
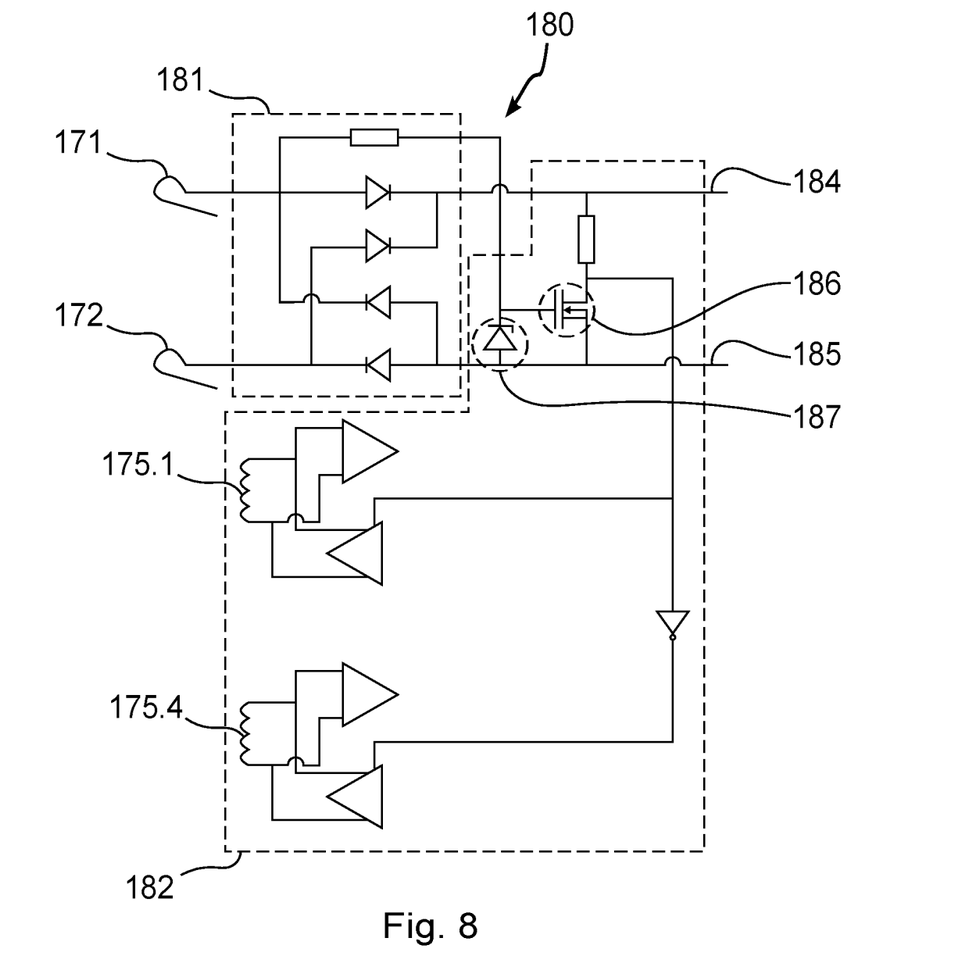
FIG. 8 is a schematic of an electronic circuit of a first type for an electronic module of the invention.

The flexible contacts 171 and 172, the magnetic couplers 175.1 to 175.12, and the optical couplers 176.1 to 176.4 are connected to an electronic circuit 180, which comprises a first circuit 181 and a second circuit 182. For reasons of clarity, only two magnetic couplers 175.1 and 175.4 of the set of magnetic couplers 175.1 to 175.6 and of optical couplers 176.1 and 176.2 are shown in the schematic of FIG. 8. The flexible contacts 171 and 172 are connected to the input terminals of a first circuit 181, which comprises a diode bridge 183. The first circuit 181 serves to deliver a constant power supply polarity between its output terminals 184 and 185 regardless of the polarity of the voltage applied between the flexible contacts 171 and 172. The second circuit 183 is connected to the magnetic couplers 175.1 and 175.4 which, in this example, are emitter/receivers in which the emission portion goes to low impedance as a function of the polarity of the voltage applied between the flexible contacts 171 and 172. This low impedance is provided by a metal oxide on silicon (MOS) transistor 186 having its gate subjected to the voltage applied between the flexible contacts 171 and 172. A zener diode 187 protects the input of the MOS transistor 186 from voltage surges. Thus, the second circuit 183 serves to modify the direction of communication of the couplers 175.1 and 175.4 as a function of the polarity of the voltage applied between the flexible contacts 171 and 172. With the second circuit 183 connected in the same manner to the other magnetic and optical couplers, it serves likewise to modify the direction of communication of the magnetic couplers 175.1 to 175.12 and of the optical couplers 176.1 to 176.4 as a function of the polarity of the voltage applied between the flexible contacts 171 and 172.

Figure 9:
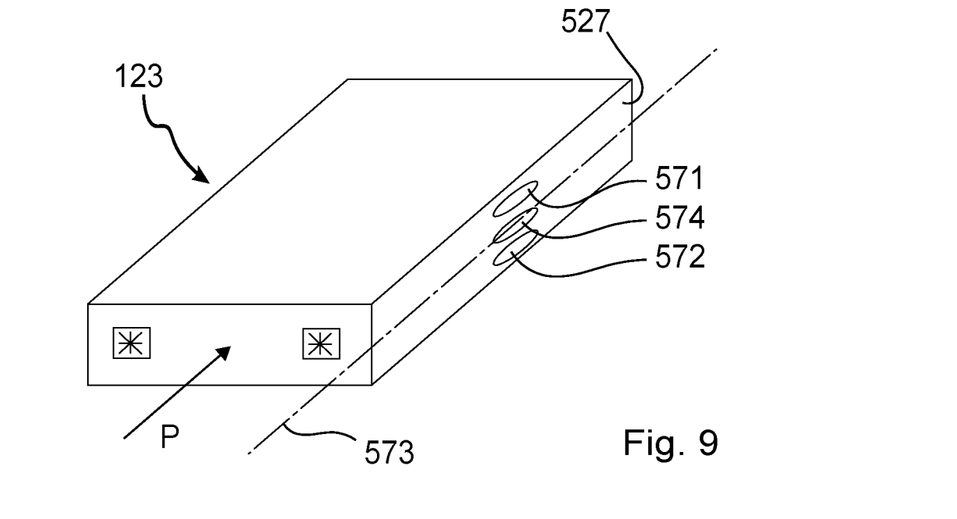
FIG. 9 is a diagrammatic perspective view of a second type of electronic module of the invention.

The module 123 also has a connection face 527 for connection to the box 100 and onto which there extend a first flexible contact 571 and a second flexible contact 572 that are arranged on either side of a middle line 573 of the connection face 527. A central third flexible contact 574 situated on the middle line 573 also extends onto the connection face 527. As can be seen in FIG. 9, the flexible contacts 571, 572, and 574 extend along an axis parallel to the middle line 573 and the connection face 527 extends parallel to the insertion axis P. The connection face 527 may include ventilation connectors (not shown) connected to the fan 140 of the module 123 and electrical connectors for monitoring operation.

With reference to FIG. 10, there follows a description of installing four identical common modules 124, 224, 324, 424 respectively in four calculation units 100, 200, 300, and 400 of a fuselage 1 of an aircraft. Elements that are identical or analogous to those of the common module 124 are given numerical references respectively increased by one hundred, two hundred, and three hundred, respectively for designating elements of the common modules 224, 324, and 424. Elements that are identical or analogous to those of the calculation unit 100 have numerical references that are increased respectively by one hundred, by two hundred, and by three hundred, for designating respective elements of the calculation units 200, 300, and 400.

The calculation units 100 and 200 are situated respectively on the right and on the left of a longitudinal axis L of the fuselage 1, and they have their respective front openings 105 and 205 opening towards the front of the fuselage 1. The calculation units 300 and 400 are situated respectively on the right and the left of a longitudinal axis L of the fuselage 1, and they have their respective front openings 305 and 405 opening towards the rear of the fuselage 1.

Figure 11:
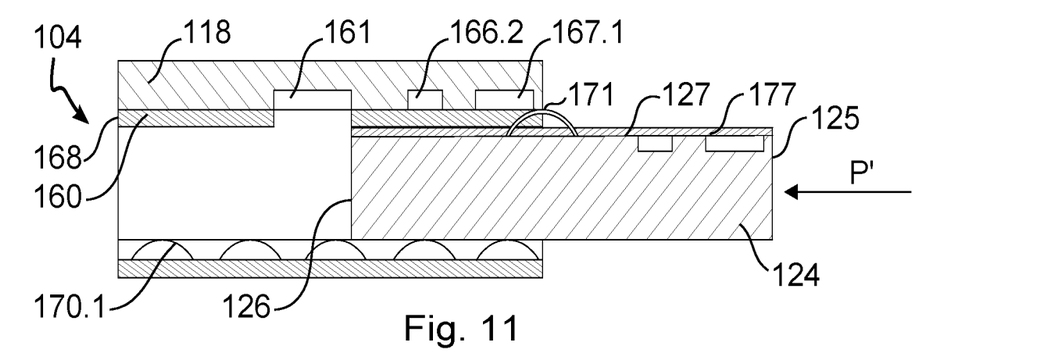
FIG. 11 is a detail view in section on plane XI-XI of FIG. 7, showing a step of mounting an electronic module in a calculation unit of the invention.
Figure 12:
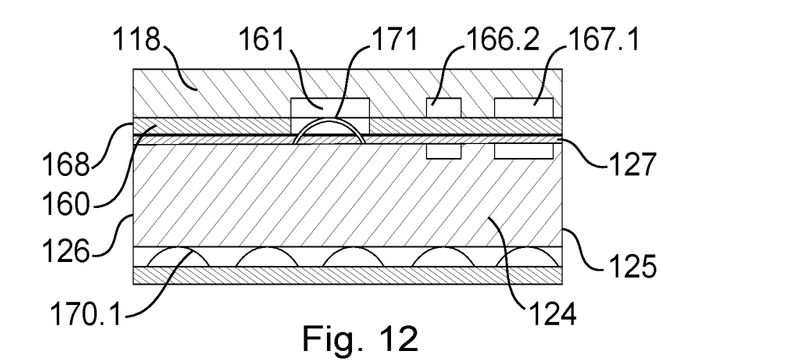
FIG. 12 is a detail view in section on plane XI-XI of an electronic module mounted in a calculation unit of the invention.

The common module 124 is mounted in the compartment 104 of the unit 100 by inserting the insertion end 126 of the common module 124 into the lateral opening 108 facing towards the middle zone 7 of the compartment 104 along an insertion axis P' perpendicular to the longitudinal axis L, the connection face 127 facing towards the front of the fuselage 1. While the common module 123 is moving in translation in the compartment 104, the PTFE layers 168 and 177 on the respective connection faces 160 and 127 come into contact under the effect of the longitudinal springs 170.1 to 170.3 and they slide one against the other. As can be seen in FIG. 11, the flexible contacts 171, 172, and 174 are pushed back by the connection face 160 as they enter into the second auxiliary compartment 104 and they slide against the PTFE layer 168 of the connection face 160 until they come respectively face to face with the conductive areas 161, 162, and 164. In this position, the optical couplers 176.1 to 176.4 and the magnetic couplers 175.1 to 175.12 of the connection face 127 of the common module 124 face respectively the optical couplers 167.1 to 167.4 and the magnetic couplers 166.1 to 166.12 of the connection face 160 of the second auxiliary compartment 104. The layers 168 and 177 also guarantee a controlled distance between the connection faces 160 and 127. The positive pole of the electrical power supply 165 of the second auxiliary compartment 104 as constituted by the first conductive area 161 is electrically in contact with the flexible contact 171 of the common module 124. The negative pole of the electrical power supply 165 of the second auxiliary compartment 104 as constituted by the second conductive area 162 is electrically in contact with the flexible contact 172 of the common module 124. Thus, the first circuit 181 receives a voltage $U_{171\text{-}172}$ measured between the first and second flexible contacts 171 and 172, which voltage is positive. The second circuit 182 then goes past the magnetic couplers 175.1 to 175.3 and 175.7 to 175.9 and also the optical couplers 176.1 to 176.3 in "emission" mode, and it goes past the magnetic couplers 175.4 to 175.6, 175.9 to 175.12, and the optical couplers 176.2 and 176.4 in "reception" mode. The common module 124 is removed from the second auxiliary compartment 104 by taking hold of the end 125 of the common module 124 in order to cause it to move in translation along the axis P'. During this movement in translation, the flexible contacts 171, 172, and 174 are pushed back by the connection face 160 and they slide against the PTFE layer 168 of the connection face 160 until the common module 124 is completely extracted from the second auxiliary compartment 104.

The common module 224 is mounted in the compartment 204 of the unit 200 by inserting the insertion end 225 of the common module 224 into the lateral opening 208 facing towards the middle zone 7 of the second auxiliary compartment 204 along an insertion axis P' perpendicular to the longitudinal axis L, the connection face 227 facing towards the front of the fuselage 1. In this position, the optical couplers 276.1 to 276.4 and the magnetic couplers 276.1 to 276.12 of the connection face 227 of the common module 224 face respectively the optical couplers 267.1 to 267.4 and the magnetic couplers 266.1 to 266.12 of the connection face 260 of the second auxiliary compartment 204. The positive pole of the electrical power supply 265 of the second auxiliary compartment 204 as constituted by the first conductive area 261 is in electrical contact with the flexible contacts 271 of the common module 224. The negative pole of the electrical power supply 265 of the second auxiliary compartment 204, as constituted by the second conductive area 262 is electrically in contact with the flexible contact 272 of the common module 224. Thus, the first circuit 281 receives a voltage $U_{271\text{-}272}$, measured between the first and second flexible contacts 271 and 272, which voltage is positive. The second circuit 282 then goes past the magnetic couplers 275.1 to 275.3 and 275.7 to 257.9 and also the optical couplers 276.1 and 276.3 in "emission" mode, and goes past the magnetic couplers 275.4 to 275.6, 275.10 to 275.12, and the optical couplers 276.2 and 276.4 in "reception" mode.

The common module 324 is mounted in the compartment 304 of the unit 300 by inserting the insertion end 326 of the common module 324 in the lateral opening 308 facing towards the middle zone 7 of the second auxiliary compartment 304 along an insertion axis P' perpendicular to the longitudinal axis L, the connection face 327 facing towards the rear of the fuselage 1. In this position, the optical couplers 376.1, 376.2, 376.3, 376.4 and also the magnetic couplers 375.1 to 375.6 and 375.7 to 375.12 of the connection face 327 of the common module 324 face respectively the optical couplers 367.4, 367.3, 367.2, and 367.1 and the magnetic couplers 366.12 to 366.7 and 366.6 to 366.1 of the connection face 360 of the second auxiliary compartment 304. The positive pole of the electrical power supply 365 of the second auxiliary compartment 304 as constituted by the first conductive area 361 is electrically in contact with the flexible contact 372 of the common module 324. The negative pole of the electrical power supply 365 of the second auxiliary compartment 304 as constituted by the second conductive area 362 is electrically in contact with the flexible contact 372 of the common module 324. Thus, the first circuit 381 receives a voltage $U_{371\text{-}372}$, as measured between the first and second flexible contacts 371 and 372, which voltage is negative. The second circuit 382 then goes past the magnetic couplers 375.1 to 375.3 and 375.7 to 357.9, and the optical couplers 376.1 and 376.3 in "reception" mode, and goes past the magnetic couplers 375.4 to 375.6, 375.10 to 375.12, and the optical couplers 376.2 and 376.4 in "emission" mode.

The common module 424 is mounted in the compartment 404 of the unit 400 by inserting the insertion end 425 of the common module 424 in the lateral opening 408 facing towards the middle zone 7 of the second auxiliary compartment 404 along an insertion axis P' perpendicular to the longitudinal axis L, the connection face 427 facing towards the rear of the fuselage 1. In this position, the optical couplers 476.1, 476.2, 476.3, 476.4 and also the magnetic couplers 475.1 to 475.6 and 475.7 to 475.12 of the connection face 427 of the common module 424 face respectively the optical couplers 467.4, 467.3, 467.2, and 467.1 and the magnetic couplers 466.12 to 466.7 and 466.6 to 466.1 of the connection face 460 of the second auxiliary compartment 404. The positive pole of the electrical power supply 465 of the second auxiliary compartment 404 as constituted by the second conductive area 461 is electrically in contact with the flexible contact 472 of the common module 424. The negative pole of the electrical power supply 465 of the second auxiliary compartment 404, as constituted by the second conductive area 462 is electrically in contact with the flexible contact 472 of the common module 424. Thus, the first circuit 481 receives a voltage $U_{471\text{-}472}$, measured between the first and second flexible contacts 471 and 472, which voltage is negative. The second circuit 482 then goes past the magnetic couplers 475.1, 475.2, 475.3, and the optical coupler 476.1 in "reception" mode, and goes past the magnetic couplers 475.4, 475.5, 475.6, and 476.2 in "emission" mode.

It can be understood that the above-described arrangement of the flexible contacts makes it possible to use identical common modules 124, 224, 324, 424 in the calculation units 100, 200, 300, and 400, since it suffices to turn the common module about its longitudinal axis so that the electrical contacts lie either on the left or else on the right.

This results in having a single model for the calculation unit that co-operates with a single type of module and that can be mounted in four different configurations without modification. The costs involved in certification, production, maintenance, and installation are thus greatly reduced.

Elements that are identical or analogous to those of the calculation unit 100 are given numerical references increased respectively by four hundred in the description below of a particular embodiment of a calculation unit of the invention.

Figure 13:
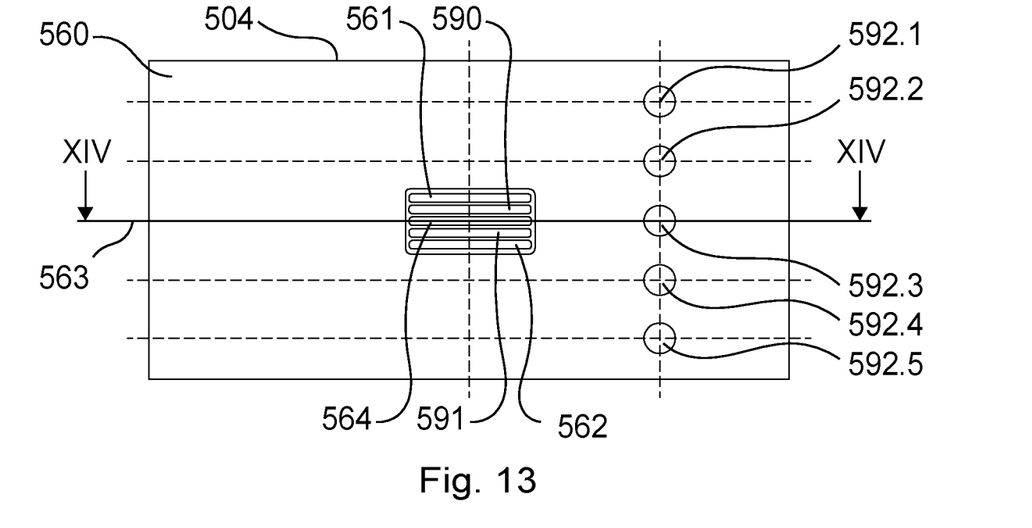
FIG. 13 is a diagrammatic view of a connection face of a particular embodiment of a calculation unit of the invention.

With reference to FIG. 13, the connection face 560 of the second auxiliary housing 504 has five conductive tracks 561, 562, 564, 590, and 591. The first conductive area 561 is connected to a first track of the printed circuit 518 and constitutes a positive pole of an electrical power supply 565, the second conductive area 562 is connected to a second track of the printed circuit 518 and constitutes a negative pole of an electrical power supply 565. The central conductive track 564 constitutes a ground of the electrical power supply 565. The additional tracks 590 and 591 that extend symmetrically on either side of the middle line 563 are respectively input ports and output ports for communication. Magnetic couplers 592.1 to 592.5 also extend onto the connection face 560. These magnetic couplers extend symmetrically on either side of the middle line 563 in the proximity of a first opening 508 of the compartment 504.

Figure 14:
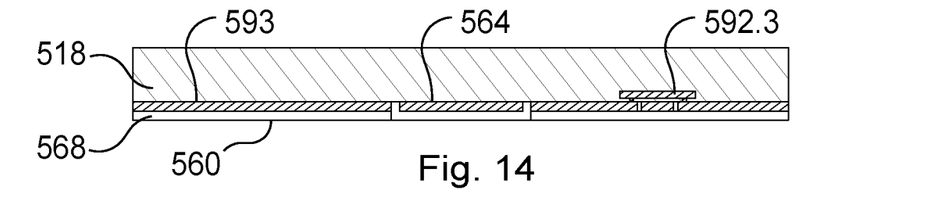
FIG. 14 is a view in longitudinal section on plane XIV-XIV of FIG. 13, showing the calculation unit.

As can be seen in FIG. 14, the printed circuit 518 has a metal plate 593 extending over the entire connection surface 560 and having fastened thereto the conductive areas 561, 562, 564, 590, and 591 and also the windings of the magnetic couplers 592.1 to 592.5. The PTFE layer 568 covers the plate 593 and includes respective gaps in register with the conductive areas 561, 562, 564, 590, 591. The printed circuit 518 also has shielding cylinders 594.1 to 594.5 for shielding the magnetic couplers 592.1 to 592.5 and extending in the proximity of the plate 593 remote from the layer 568.

Figure 15:
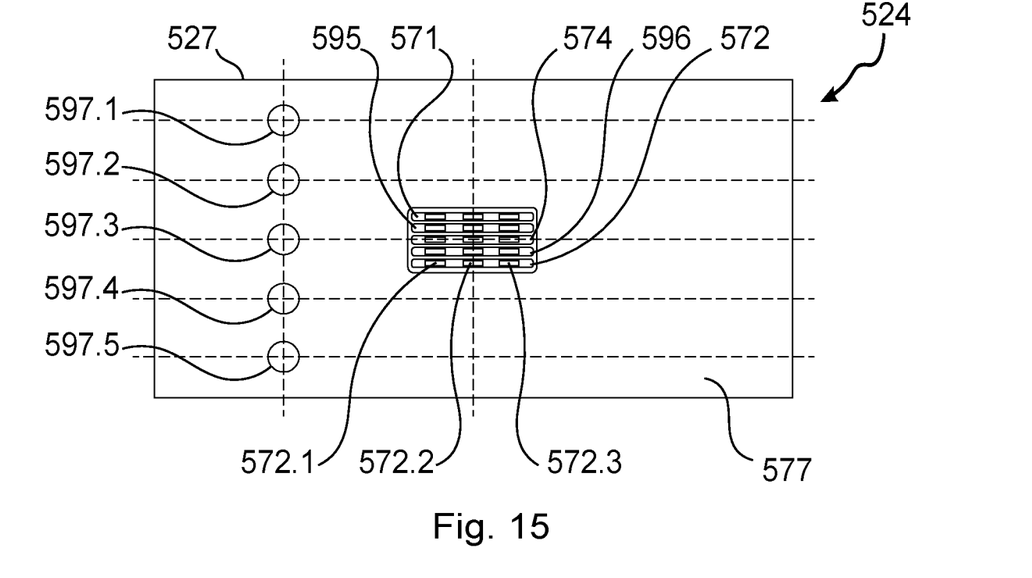
FIG. 15 is a diagrammatic view of a connection face of a common module in a particular embodiment of the invention.
Figure 16:
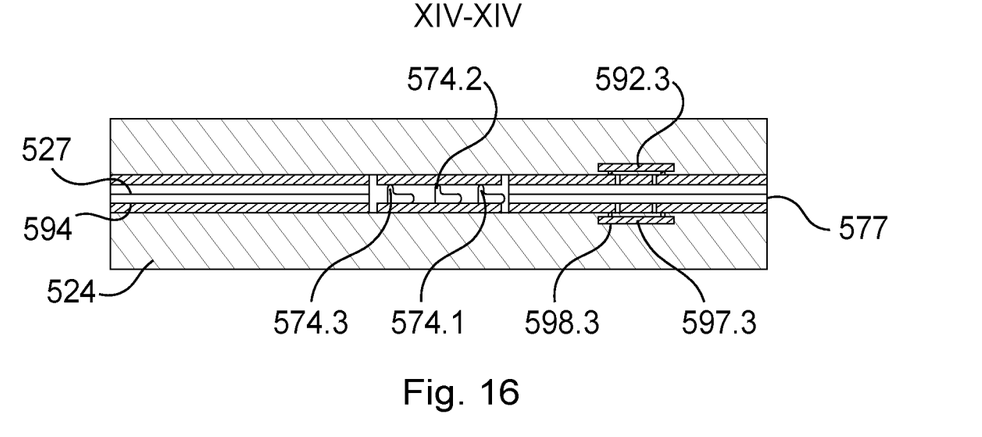
FIG. 16 is a view in section on plane XIV-XIV showing the FIG. 14 calculation unit assembled with the FIG. 15 common module.

As can be seen in FIGS. 15 and 16, the connection face 527 of the common module 524 also has a metal plate 594 extending over the entire connection surface 560 and having fastened thereto the flexible contacts 571, 572, 574, 595, and 596 and also windings of the magnetic couplers 597.1 to 597.5. The flexible contacts 571, 572, 574, 595, and 596 respectively comprise three resilient bridges 571.1 to 571.3, 572.1 to 572.3, 574.1 to 574.3, 595.1 to 595.3, and 596.1 to 596.3. The PTFE layer 577 covers the plate 594 and includes respective gaps in register with the conductive areas 571, 572, 574, 595, 596. The connection face 560 also has shielding cylinders 598.1 to 594.5 for shielding the magnetic couplers 592.1 to 592.5 and extending in the proximity of the face of the plate 593 opposite from the layer 568.

When the common module 524 is in place in the second auxiliary housing 504 (FIG. 16), the magnetic couplers 597.1 to 597.5 of the common module 524 face the magnetic couplers 592.1 to 592.5 of the calculation unit 500, thereby providing magnetic coupling between the unit 500 and the module 524. The resilient bridges of the flexible contacts 571, 572, 574, 595, and 596 come respectively into contact with the conductive areas 561, 562, 564, 590, and 591, thereby powering the common module 524 from the power supply 565 and putting the common module 524 into communication with the calculation unit 500. The facing metal plates 593 and 594 provide effective capacitive coupling between the common module 524 and the calculation unit 500.

Figure 17:
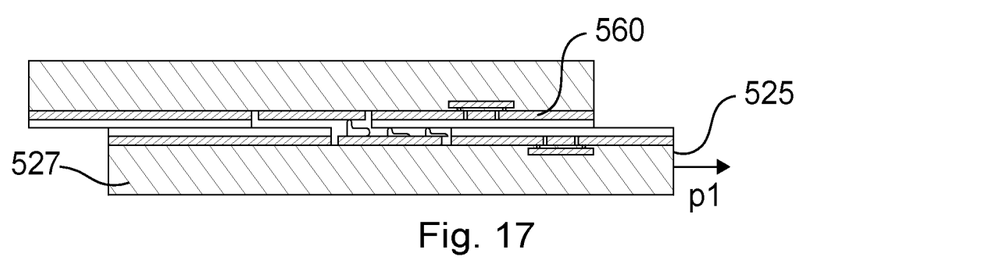
FIG. 17 is a view similar to the view of FIG. 16, showing a first step of removing the common module.
Figure 18:
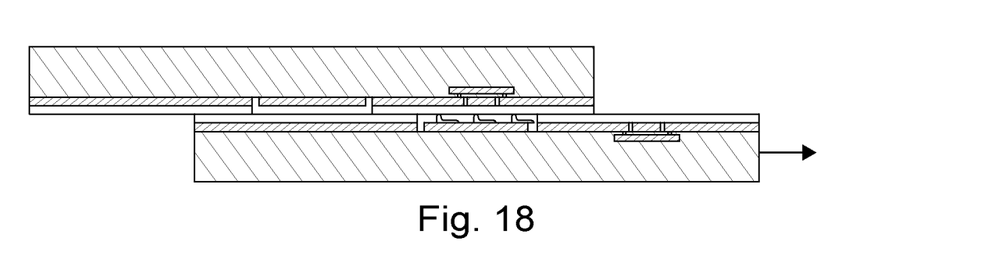
FIG. 18 is a view similar to the view of FIG. 16 showing a second step of removing the common module.
Figure 19:
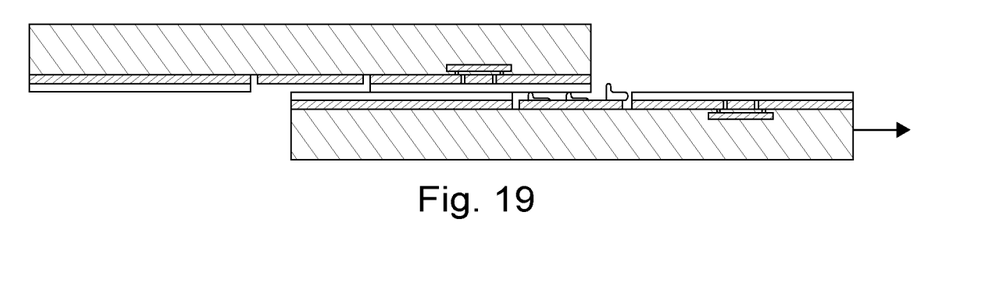
FIG. 19 is a view similar to the view of FIG. 16, showing a third step of removing the common module.

The common module 524 is removed from the second auxiliary compartment 504 by taking hold of the end 525 of the common module 524 so as to cause it to move in translation along the axis P'. During this movement in translation, the bridges of the flexible contacts 571, 572, and 574 are pushed back by the connection face 560 and they slide against the PTFE layer 568 of the connection face 560 until the common module 524 is completely extracted from the second auxiliary compartment 104 (FIGS. 17 to 19).

The calculation units 100 are arranged in at least one of the lateral housings 6 so that the insertion axis I is substantially parallel to the longitudinal axis L of the fuselage 1. It should be observed that removing the panel 109 gives access directly to the calculation module 122 that is closest to the middle zone 7.

More precisely, the calculation units 100 are mounted in pairs in adjacent positions in the lateral housings 6 so that the back walls 116 of the boxes 101 extend facing each other. Cables 8 of the electrical harness 9 are taken between the two calculation units 100 in order to be connected thereto via the connectors 115 and 119, thereby facilitating connecting the calculation units 100 to the electrical harness 9.

It can be understood that the above-described arrangement of the flexible contacts makes it possible to use identical common modules 123 and 124 in both calculation units 100 since it suffices to turn the common module about its longitudinal axis and the insertion axis for the electrical contacts to be located either on the left or else on the right.

Figure 4:
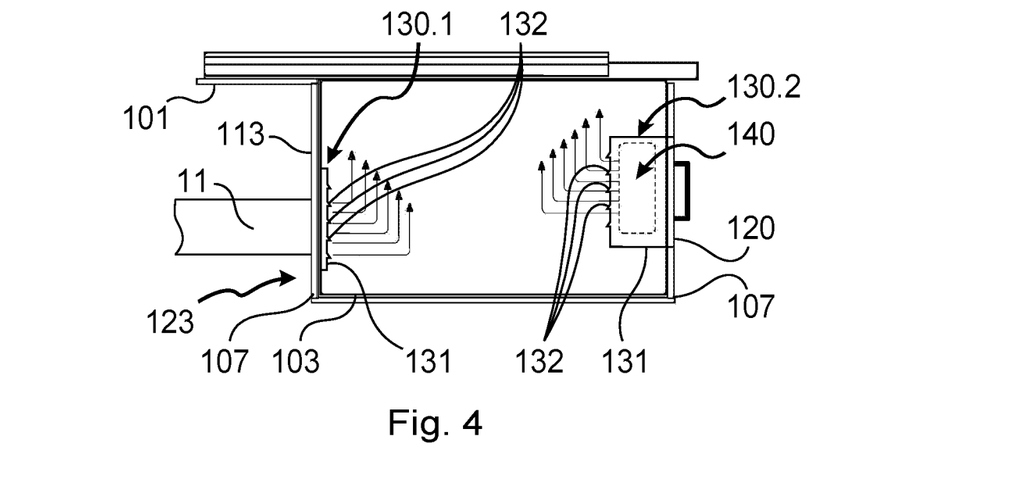
FIG. 4 is an enlarged diagrammatic view in section on plane II of FIG. 1 showing the common cooling and power supply module.

The common module 123 is described in detail below. A duct 11 extending between the fuselage 1 and the calculation unit 100 serves to connect the main pipe 10 closest to an air intake mounted on the panel 110 so as to open out facing an opening in the common module 113 having a first check valve 130.1 arranged facing it so as to allow cooling air to pass from the duct 11 to the common module 123 while opposing any flow of air in the opposite direction. The common module 123 has an external air intake 120 that opens out into the central zone 7 and that is associated with a fan 140 for injecting air into the common module 123 and with a second check valve 130.2 that is arranged to allow air to pass from the fan 140 to the common module 123 while opposing any flow of air in the opposite direction. The common module 123 has a top wall provided with air discharge openings leading to the main compartment 102.

The check valves 130.1 and 130.2 are similar to each other and in this example each of them comprises a hollow body 131 fastened to one of the lateral walls of the common module 123 and connected in sealed manner to the duct 11 for the valve 130.1, or to the outlet from the fan 140 for the valve 130.2. The body 131 has a plurality of openings, each having a flap 132 facing it with an edge on one side that is free and on the opposite side, an edge that is hinged to the body 131 so that the flap 132 can pivot between a closed position and an open position. The flaps 132 are thus positioned in such a manner that they can be lifted by a stream of air going towards the inside of the common module 123 so as to allow the stream of air to pass, but they are pressed down into a closed position by any stream of air in the opposite direction. By way of example, the return means may comprise a spring rated to allow the flaps 132 to be lifted by a stream of air entering into the common module 123 without giving rise to a loss of head in the stream of air that would prevent it from traveling along the common module 123 and the main compartment 102. In a variant, the return means could be provided by gravity. It can be understood that:

when the air-blowing system of the aircraft is in operation, the check valve 130.1 allows air to pass and the fan 140 is stopped, when the check valve 130.2 prevents the passage of air coming from the check valve 130.1; and when the air-blowing system of the aircraft has failed, the fan 140 is put into operation to blow air so that the check valve 130.2 allows air to pass, while the check valve 130.1 prevents the passage of air coming from the check valve 130.2. The fan 140 is put into operation under control delivered via the electrical harness 9 after detecting a failure of the air-blowing system of the aircraft.

Figure 5:
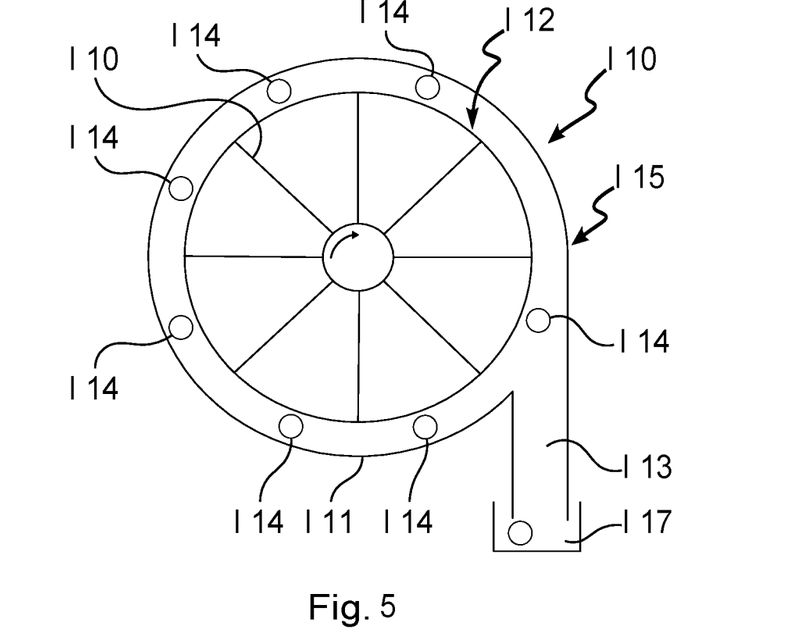
FIG. 5 is a diagrammatic front view of a fan in this common cooling and power supply module.

The fan 140 in this example comprises an impeller wheel 141 driven by an electric motor (not shown) to rotate inside a casing 142. The casing 142 has two walls 143 perpendicular to the axis of rotation of the impeller wheel 141, which walls are connected together by a circular peripheral wall 144 surrounding the impeller wheel 141 and extending between the walls 143. One of the walls 143 is fastened to the wall of the common module 123 and the other one of the walls 143 is provided with air exhaust orifices 145 in the vicinity of the circular peripheral wall 144, while being spaced apart from the circular peripheral wall 144. The circular peripheral wall 144 extends around the impeller wheel 141 and has a bottom portion that is extended tangentially by a vertical tangential passage 146 having a container 147 fastened thereto. The impeller wheel 141 has a hollow hub forming a duct in communication with the air intake 120 so that rotation of the impeller wheel 141 tends to entrain air coming from the air intake 120 and going towards the orifices 145 in the casing 142. Any dust that might be found in the air stream is entrained by the centrifugal effect against the circular peripheral wall 144 and then into the vertical tangential passage 146 and the container 147, where the dust is trapped. Cleaning the container 147 serves to remove the dust.

Naturally, the invention is not limited to the embodiments described but covers any variant coming within the ambit of the invention as defined by the claims. In particular, the housing of the calculation unit 100 may be of some other shape and may have some other number of auxiliary compartments, and need not have any auxiliary compartment at all.

Although the presently-described module is a module that is common to the calculation modules, the invention applies equally well to other types of electronic module, e.g. such as fan modules or modules dedicated to only some of the calculation modules or to only one of them.

Although in this example the electronic module is powered using oblong conductive areas, the invention applies equally well to other means for electrically powering the electronic module, such as for example conductive areas that are circular or inductive connectors without contact.

Although in this example the connection faces of the electronic module and of the second auxiliary compartment have a coating of PTFE, the invention applies equally well to other types of coating that reduce friction, such as coatings of polychlorotrifluoroethylene (PCTFE), fluoroethylene (FE), methylfluoroalkoxy (MFA), or other polymers. The invention also applies to a single connection face—of the electronic module or of the calculation unit—that is provided with a coating for reducing friction. The coating may extend over the entire connection face or over only a portion of the face.

Although in this example the second auxiliary compartment has three longitudinal springs, the invention applies equally well to other types of resilient element arranged to exert a force to establish contact against the connection face, such as for example a single longitudinal spring, rubber blades, or spiral springs.

Although in this example the common module is substantially of rectangular box shape, the invention applies equally well to modules of some other shape, such as for example right cylindrical or triangular modules.

Although in this example, the electronic module has flexible contacts, the invention applies equally well to other means for connecting to an electrical power supply, such as for example stationary electrical connection studs, inductive connectors that do not make contact, or conductive brushes.

Although in this example, the electronic module, like the calculation unit, has optical couplers and magnetic couplers, the invention applies equally well to other connection means, such as for example conductive areas or radio or microwave transceivers. Magnetic and/or optical connections are preferred since they provide electrical decoupling between the electronic module and the calculation unit.

Although in this example the connection means are distributed symmetrically about a middle axis and a plane orthogonal to that axis, the invention applies equally well to connection means distributed in some other way, it then being necessary likewise to be able to reverse the common module about an axis perpendicular to its insertion axis. Under such particular circumstances, the common module is inserted into the compartment always via the same insertion end. Although in this example the unit is a calculation unit, the invention applies equally well to other types of electronic unit, such as for example a communications unit, an air conditioning unit, etc.

In a variant, the common module is arranged to provide a single transverse function, for example supplying electrical power to the calculation modules, cooling the calculation modules, or providing interconnections between the calculation modules.

In a variant, it is possible to use common modules that are for use in one position only, either having flexible contacts on the right or flexible contacts on the left. In another variant, the common modules have a back provided with a connector and the box of the calculation unit may be fitted with a complementary connector that is movable so as to be mounted on the backplanes of the auxiliary compartments, regardless of the direction in which the calculation unit is mounted in the lateral housing.

In a variant, other ventilation means could be used, for example a fan arranged behind a filter serving to prevent dust being injected into the common cooling module.

The cooling module of the invention can be used in applications other than aviation applications.

The invention claimed is:

1. A cooling module comprising a first air inlet, a second air inlet, and an air discharge vent, the module having two check valves, each mounted in register with a respective inlet and arranged to allow air to pass towards the inside of the module and to oppose a flow of air in the opposite direction, the first air inlet being connected to a pipe of air under pressure, and the second air inlet being an external air intake associated with a fan for injecting air into the common module.

2. The module according to claim 1, wherein the fan is associated with a device for filtering air by centrifuging.

3. The module according to claim 2, wherein the fan comprises an impeller wheel driven by an electric motor to rotate in a casing, a circular peripheral wall extended tangentially by a vertical tangential passage having a bottom end with a dust-recovery container fastened thereto, the casing including an air inlet orifice in the vicinity of the axis of rotation of the impeller and at least one air outlet orifice in the vicinity of the circular peripheral wall.

4. An electronic unit comprising a box defining: a main compartment containing calculation modules suitable for insertion into the main compartment along an insertion axis through a first opening in the compartment and connectable to connectors carried by a back wall of the compartment so as to extend inside the compartment opposite from the first opening, and an additional compartment for receiving a cooling module according to any preceding claim, the additional compartment being arranged under the calculation modules and being in communication with the main compartment, the box including an air discharge vent leading out from the main compartment above the calculation modules.

5. The unit according to claim 4, wherein at least one of the calculation modules includes pins for engaging in metal-plated holes of a printed circuit board, the printed circuit board being covered in a layer of electrically insulating flexible material that is pierced by the pins when they are engaged in the metal-plated holes and that is clamped between a support for the pins and the printed circuit board.

6. The unit according to the claim 5, wherein the electrically insulating material is a silicone, and more particularly a silicone for room temperature vulcanization.

* * * * *